United States Patent [19]

Sano et al.

[11] Patent Number: 4,467,440
[45] Date of Patent: Aug. 21, 1984

[54] DIGITAL FILTER APPARATUS WITH RESONANCE CHARACTERISTICS

[75] Inventors: Shigenori Sano, Tokyo; Kohtaro Hanzawa, Niiza, both of Japan

[73] Assignee: Casio Computer Co., Ltd., Tokyo, Japan

[21] Appl. No.: 279,630

[22] Filed: Jul. 1, 1981

[30] Foreign Application Priority Data

| Jul. 9, 1980 | [JP] | Japan | 55-94461 |
| Jul. 9, 1980 | [JP] | Japan | 55-94462 |
| Jul. 9, 1980 | [JP] | Japan | 55-94463 |
| Jul. 9, 1980 | [JP] | Japan | 55-94466 |

[51] Int. Cl.³ .................................... G06F 15/31
[52] U.S. Cl. .................................... 364/724; 333/166
[58] Field of Search .................... 364/724; 333/166

[56] References Cited

U.S. PATENT DOCUMENTS

| 3,706,076 | 12/1972 | Schuster | 364/724 |
| 3,955,193 | 5/1976 | Koffler et al. | 364/724 |
| 4,146,931 | 3/1979 | Delforge | 364/724 |

FOREIGN PATENT DOCUMENTS 2621113 12/1976 Fed. Rep. of Germany .
55-80913 6/1980 Japan .

OTHER PUBLICATIONS

Anderson, "Programmable Digital Filter Performs Multiple Functions" *Electronics* Oct. 26, 1970, pp. 78–84.
Rader et al., "Digital Filter Design Techniques in the Frequency Domain" *Proceedings of the IEEE*, vol. 55, No. 2, Feb. 3 '67, pp. 149–171.
Gardner, "Reduction of Sensitivities in Sampled-Data Filters" *IEEE Trans. on Circuit Theory* Nov. 3 '70 pp. 660–663.
Gorshkov, "Digital Band Filter" *Instrum. & Exp. Tech.* (USA) vol. 22, No. 3, Nov. 1979, pp. 717–721.

*Primary Examiner*—David H. Malzahn
*Attorney, Agent, or Firm*—Frishauf, Holtz, Goodman & Woodward

[57] ABSTRACT

A basic coefficient to be used for calculation of a transfer function of a digital filter is read out from a ROM according to a cutoff frequency of a desired filter. The value of the coefficient read out from the ROM is gradually varied according to a desired resonance characteristic by an arithmetic circuit so as to reduce the memory capacity of the ROM for storing coefficients.

12 Claims, 18 Drawing Figures

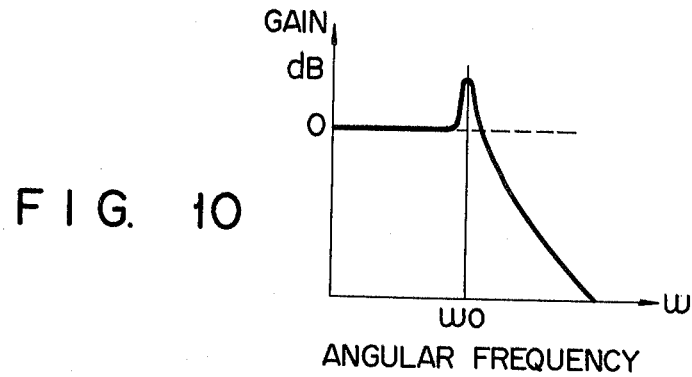
FIG. 10
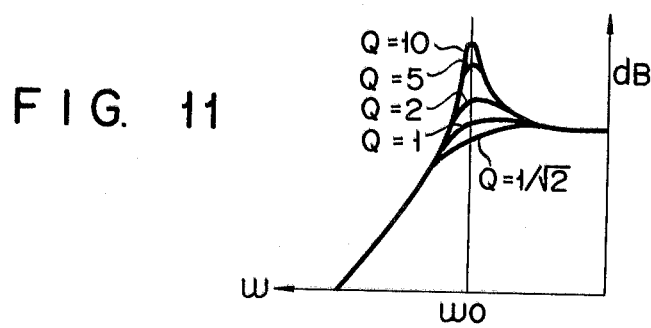
FIG. 11
FIG. 12
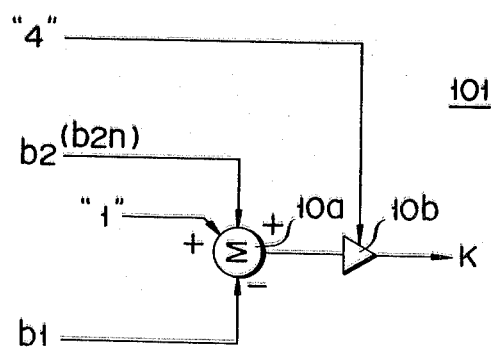

DIGITAL FILTER APPARATUS WITH RESONANCE CHARACTERISTICS

BACKGROUND OF THE INVENTION

The present invention relates to a digital filter apparatus having a resonance characteristic.

As an alternative to an analog filter incorporating a transistor, a resistor, a capacitor, a coil or an operational amplifier, a digital filter incorporating a digital circuit such as a multiplier, an adder, or a delay circuit has recently received a lot of attention. Such a digital filter is used, for example, as a tone color setting circuit of an electronic musical instrument. These digital filters may be, for example, low-pass filters, high-pass filters and band-pass filters. For example, some analog type music synthesizers incorporate an analog filter having a resonance characteristic in order to add special tone color to the sound. When a filter having a resonance characteristic is used, a peak is generated in the amplitude of the musical sound signal and a musical sound is obtained which has a special tone color in which this frequency component is emphasized. Although it is possible to construct a digital filter having such a resonance characteristic, a ROM of large capacity as an element of the digital filter is generally necessary, resulting in a disadvantage. This will be described in more detail.

For designing a filter, a transfer function must first be obtained. A method is known for designing a digital filter according to which a transfer function H(s) of an analog filter is first obtained and then it undergoes the standard z-transform, the bilinear z-transform, or the alignment z-transform to obtain a transfer function H(z) of the desired digital filter.

An example of a second-order low-pass filter will be described. A transfer function H(s) of the second-order low-pass filter is generally expressed by $$H(s) = \frac{H\omega 0^2}{s^2 + \frac{\omega 0}{Q} s + \omega 0^2} \quad (1)$$

where H is the gain which is generally 1, Q is the amplitude of the resonance, which is $1/\sqrt{2}$ under the normal non-resonance condition, and $\omega 0$ is the resonance angular frequency. Under this normal condition, the poles of this low-pass filter have two conjugate roots represented by P1, P2 of the s-plane as shown in FIG. 1 and may be expressed by the equation $$z = \left( -\frac{1}{\sqrt{2}} \pm j \frac{1}{\sqrt{2}} \right) \cdot \omega 0 \quad (2)$$

As may be seen from the characteristic graph in FIG. 1, the poles P1, P2 move to the points (O, $\pm \omega O$) on the imaginary axis (j$\omega$) as Q increases according to $1/\sqrt{2}$, 1, 2, ... FIG. 2 is a characteristic graph of a low-pass filter having a resonance characteristic at frequency $\omega O$.

When the transfer function H(s) of equation (1) undergoes the bilinear z-transform, the transfer function H(z) of the digital filter is expressed by $$H(z) = \frac{K(1 + z^{-1})^2}{1 + b1 z^{-1} + b2 z^{-2}} \quad (3)$$

where b1, b2, and K are constants respectively expressed by the following equations:

$$b1 = \frac{2\omega 0^2 - \frac{8}{Ts^2}}{\omega 0^2 + \frac{2\omega 0}{QTs} + \frac{4}{Ts^2}} \quad (4)$$

$$b2 = \frac{\omega 0^2 - \frac{2\omega 0}{QTs} + \frac{4}{Ts^2}}{\omega 0^2 + \frac{2\omega 0}{QTs} + \frac{4}{Ts^2}} \quad (5)$$

$$K = \frac{H\omega 0^2}{\omega 0^2 + \frac{2\omega 0}{QTs} + \frac{4}{Ts^2}} \quad (6)$$

where Ts is the sampling time and z is the variable of the bilinear z-transform.

Therefore, the digital filter apparatus whose transfer function H(z) is expressed by equation (3) is constructed as shown in FIG. 3. Referring to FIG. 3, reference numeral 1 denotes an adder to which an input signal is supplied. The output of the adder 1 is supplied to another adder 2 and a sampling time (Ts) delay circuit 3. The output of the delay circuit 3 is supplied to multipliers 4 and 5. To the multiplier 4 is supplied data b1 from a ROM 6 selected by respective control data of a signal of resonance angular frequency $\omega O$ and Q representing the amplitude of resonance which have been supplied to the ROM 6. The input signal supplied to the multiplier 4 is multiplied by b1, and the product is supplied to the adder 1. This input signal to the adder 1 instructs the adder 1 to perform subtraction. The multiplier 5 has the function of doubling the input signal, and its output is supplied to the adder 2. The output of the delay circuit 3 is also supplied to a delay circuit 7 which delays its input signal by the sampling time (Ts). The output of the delay circuit 7 is supplied through a multiplier 8 to the adder 1 as well as directly to the adder 2. The data b2 selected by the control data supplied to the ROM 6 is supplied to the multiplier 8 for multiplication with the input signal, and the multiplication product is supplied to the adder 1. This input signal to the adder 1 instructs the adder 1 to perform subtraction. The output of the adder 2, to which are supplied the outputs of the adder 1, the multiplier 5 and the delay circuit 7 for addition thereof, is supplied to a multiplier 9. To the multiplier 9 is also supplied data K selected from the ROM 6 by the control data. The input to the multiplier 9 from the adder 2 is multiplied K times and is output.

However, with the digital filter apparatus as described above, when the amplitude of the resonance is of level n, the capacity of the ROM 6 for storing coefficients must be n times that for the case without resonance, thus demanding a ROM of very large capacity.

In general, it is the ROM which occupies a relatively large area on the semiconductor chip when integrating the digital filter. Therefore, an increase in the capacity of the ROM means a corresponding reduction in available area for elements other than the ROM on a chip of a certain area, which runs contrary to the demand for multifunctionality of the digital filter.

SUMMARY OF THE INVENTION

It is, therefore, an object of the present invention to provide a digital filter apparatus having a variable resonance characteristic according to which the memory capacity for storing coefficients may be reduced and higher integration may be achieved.

The above and other objects of the present invention are achieved according to the present invention by a digital filter apparatus wherein a coefficient for varying the resonance characteristic among coefficients read out from a memory for obtaining a transfer function is varied by an arithmetic circuit so that the memory capacity for storing the coefficients may be reduced to the minimum.

The object of the present invention is further achieved by a digital filter apparatus wherein means for calculating at least one coefficient for obtaining a transfer function utilizing other coefficients is incorporated to further decrease the memory capacity required for storing the coefficients.

BRIEF DESCRIPTION OF THE DRAWINGS

FIG. 10 is a frequency characteristic graph of the digital low-pass filter according to the embodiment shown in FIG. 9;

FIG. 11 is a frequency characteristic graph of a digital high-pass filter having a resonance characteristic;

FIG. 12 is a block diagram showing part of the constituting circuit of a digital high-pass filter according to still another embodiment of the present invention;

DESCRIPTION OF THE PREFERRED EMBODIMENTS

Preferred embodiments of the present invention will now be described with reference to the accompanying drawings.

When $Q=(1/\sqrt{2})$ in an analog transfer function H(s) as represented by equation (1) above, that is, when a second-order Butterworth type low-pass filter undergoes the bilinear z-transform for obtaining a digital transfer function H(z), it is expressed as equation (3) and the corresponding values of b1, b2 and K are obtained by substituting $Q=(1/\sqrt{2})$ in equations (4) to (6). The movement of the poles of this low-pass filter when the cutoff frequency fc is varied may be as shown in FIG. 4.

Figure 4:
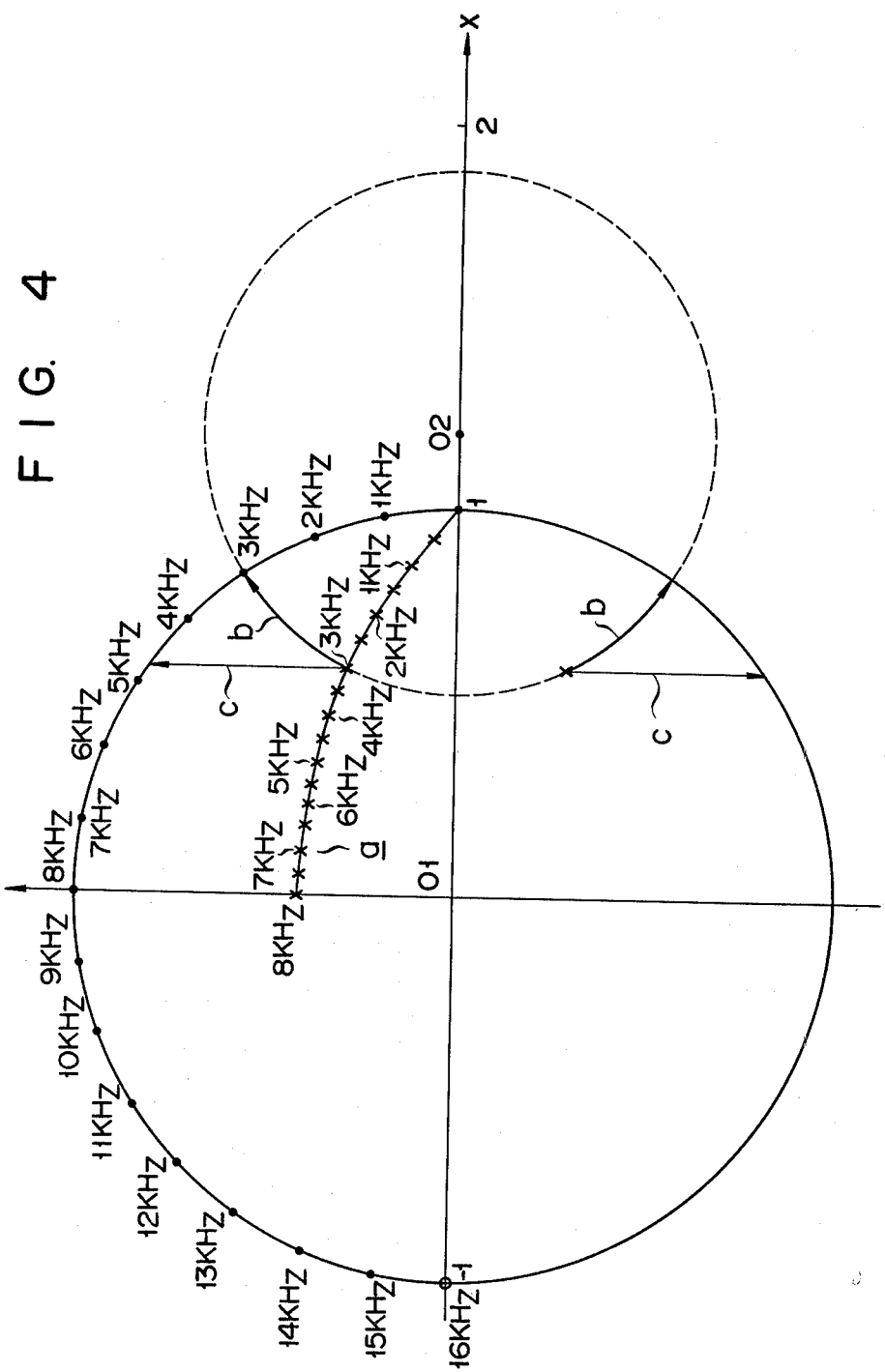
FIG. 4 is a graph showing the movement of poles as a function of frequency on the z-plane for explaining the operation of the digital filter of the present invention.

FIG. 4 thus shows the z-plane wherein a curve a represents the locus (hereinafter referred to as a root locus) of the poles as calculated with a sampling rate of 32 kHz. Numerals on the locus represent values of the cutoff frequency fc which are sampled at a frequency of every 500 Hz. The value of this root locus becomes is as expressed by $$z = -\frac{b1}{2} \pm j\frac{\sqrt{4b^2 - b1^2}}{2} \quad (7)$$

only if the denominator in equation (3) is zero. Numerals on unit circle 01 represent frequencies when the angular velocity is $\Omega = 2\pi fcTs$ and $(-1, 0)$ represents a zero of second-order.

Considering the case wherein the cutoff frequency fc is 3 kHz, when resonance occurs in a digital filter equivalent to the analog filter described above, the pole moves along a Butterworth circle 02 (curve b) as shown in the figure. Assuming now that $$A = \tan \pi fcTs (\approx 0.3033) \quad (8)$$

and the distance between the centers of circles 01 and 02 as $$\frac{1 + A^2}{1 - A^2} \quad (\approx 1.2026),$$

the radius of the Butterworth circle 02 may be obtained as $$\frac{2A}{1 - A^2} \quad (\approx 0.6682).$$

Since the poles expressed by equation (7) are conjugate roots, the following relations are obtained $$b1 = -2x \quad (9)$$

$$b2 = r^2 \quad (10)$$

where r is the distance between one pole and the origin 01 and x is its value on the real axis.

For realizing a filter with a resonance characteristic wherein a peak is generated at a certain frequency, it suffices that the locus of poles approach the unit circle 01. According to this embodiment, $r^2$, that is, coefficient b2 alone, is varied along line c of FIG. 4, and the amplitude of resonance has three levels. The coefficient in this case in b2n which is given by $$b2n = b2 + \frac{1-b2}{2^2} \cdot 2^n (n = -\infty, 0, 1) \quad (11)$$

Figure 3:
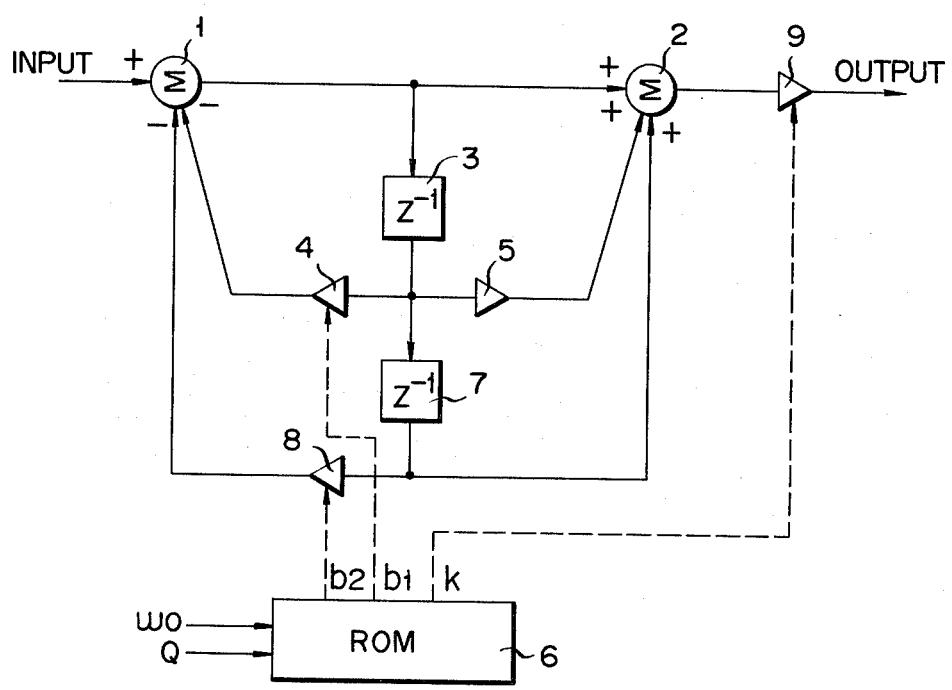
FIG. 3 is a block diagram of a digital filter corresponding to the analog filter of the characteristic of FIG. 1 and incorporating a ROM.
Figure 5:
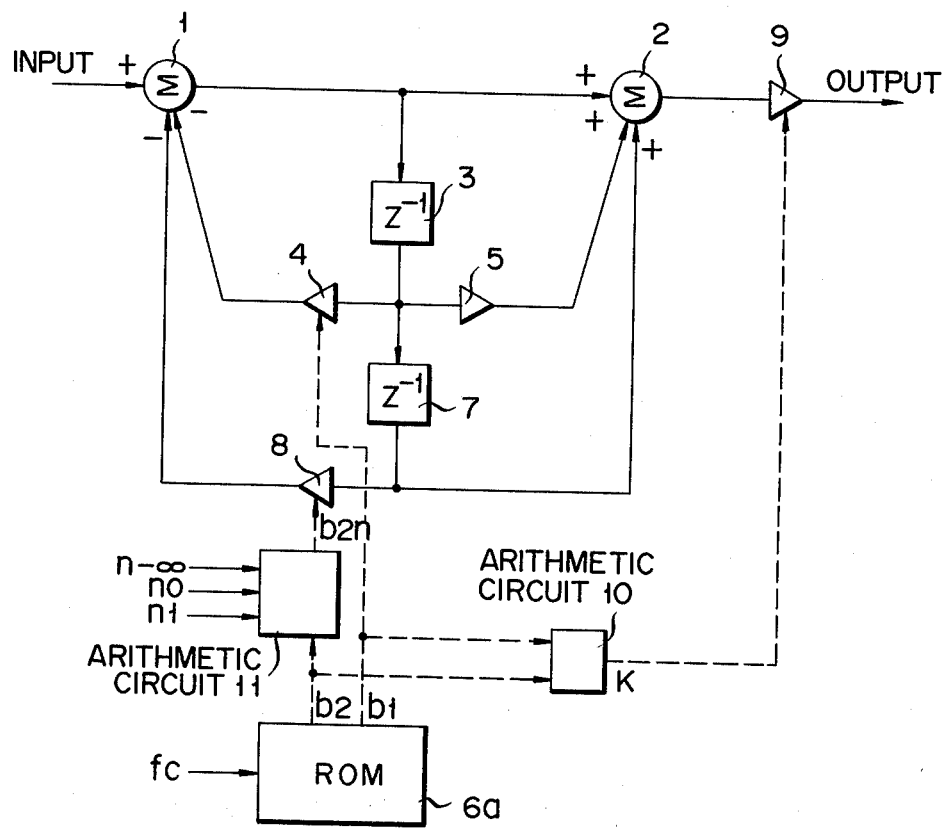
FIG. 5 is a block diagram of a digital low-pass filter according to one embodiment of the present invention.

FIG. 5 shows a block diagram of this embodiment wherein the same reference numerals denote the same parts as in FIG. 3 for the sake of simplicity; the description thereof will be omitted.

Referring to FIG. 5, coefficients b1 and b2 corresponding to the cutoff frequency fc are stored in a ROM 6a. A coefficient K is calculated from the coefficients b1 and b2 at an arithmetic circuit 10 and is supplied to the multiplier 9. The arithmetic circuit 10 performs a calculation of $$K = \frac{1 + b1 + b2}{4}$$

as may be seen when H=1 is substituted in equations (4) to (6). The arithmetic circuit 10 comprises an adder and so on, the details of which will be described later.

Reference numeral 11 denotes an arithmetic circuit which calculates the coefficient b2n by executing the operation corresponding to equation (11) with the coefficient b2 supplied from the ROM 6a. Outputs b2n as shown in Table 1 are obtained according to three control signals of n1, n0 and n−∞.

TABLE 1

| n | b2n |
|---|---|
| n1(n = 1) | $\frac{1 + b2}{2}$ |
| n0(n = 0) | $\frac{1 + 3b2}{4}$ |
| n − ∞(n = −∞) | b2 |

Figure 6:
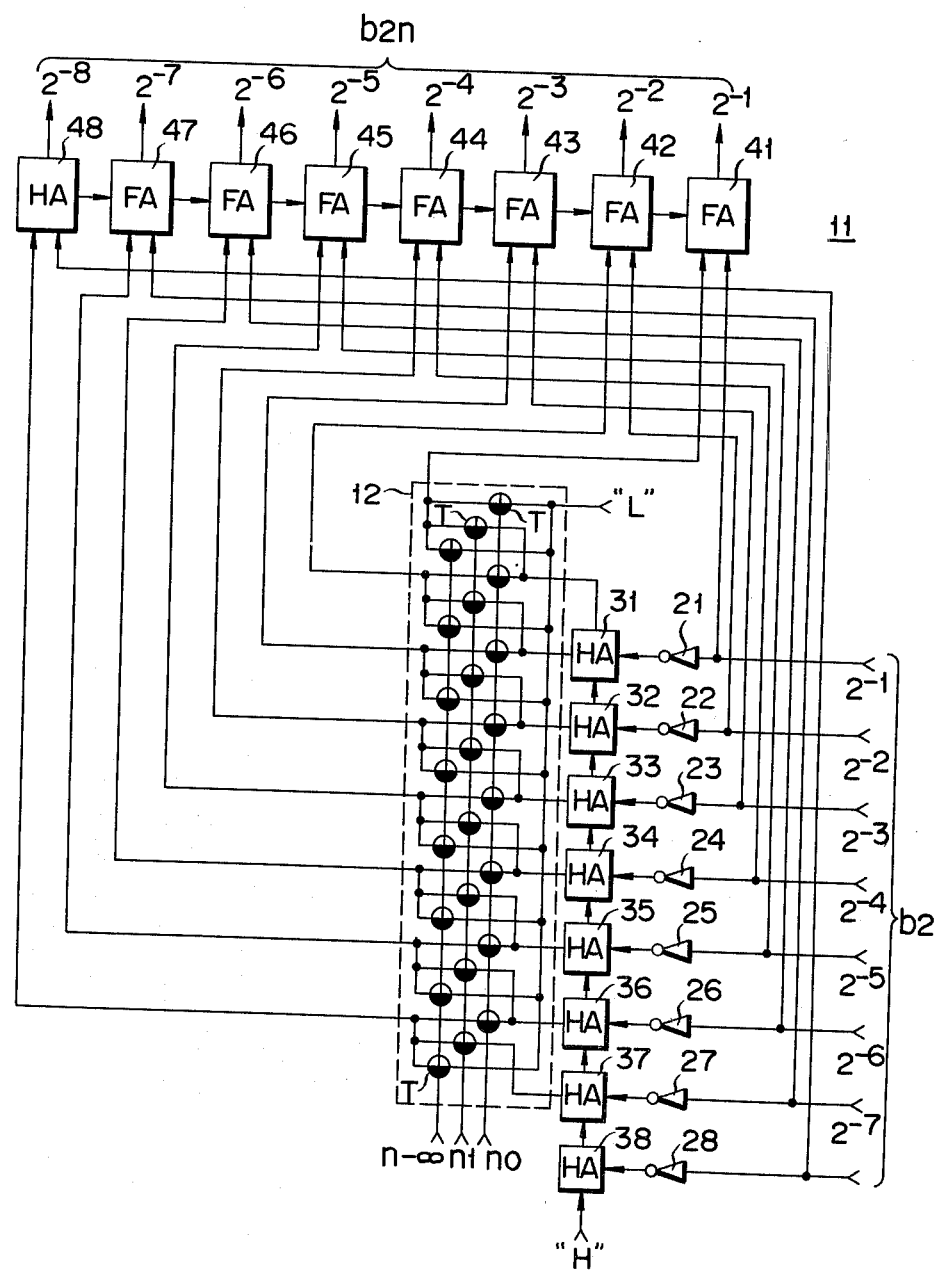
FIG. 6 is a block diagram of an arithmetic circuit in the filter of FIG. 5.

The arithmetic circuit 11 is of the construction shown in FIG. 6. The coefficient b2 which is the input data to the arithmetic circuit 11 from the ROM 6a is of 8-bit construction, the respective bits of which are assigned weights of $2^{-1}$ to $2^{-8}$. This input data is supplied to half-adders 31 through 38 through inverters 21 through 28 as well as directly to full-adders 41 through 47 and a half-adder 48.

A high level signal representing logic value "1" is supplied to the other input terminal of the half-adder 38 which adds the value of $2^{-8}$ to the input data b2 and supplies a carry signal to the half-adder 37 corresponding to the upper significant bit. To the other input terminals of the respective half-adders 31 to 37 are input carry signals from the half-adders of the respective lower significant bits. Thus, the outputs of the half-adders 31 to 37 are those respectively inverted bits of the data b2 and are added "1" to the least significant bit thereof, and therefore are in the form of −b2, which is the complement of 2. By using the carry signal output from the half-adder 31 as the most significant bit, these outputs represent 1−b2.

The outputs of these half-adders 31 to 37 and the carry signal output from the half-adder 31 are supplied together with a low level signal representing the logic value "0" to a shift circuit 12 which comprises a plurality of transfer gates T. The shift operation of the shift circuit 12 is controlled by the three control signals n0, n1 and n−∞ for controlling the amplitude of resonance. The shift circuit 12 outputs signals which are supplied to the other input terminals of the full-adders 41 to 47 and the half-adder 48.

When the control signal n−∞ is "1", all the outputs of the shift circuit 12 become zero and therefore the coefficient data b2 is output as data b2n directly from the full-adders 41 to 47 and the half-adder 48.

When the control signal n1 is "1", the carry signal output from the half-adder 31 and the outputs of the half-adders 31 to 37 are supplied to the full-adders 41 to 47 and the half-adder 48. Therefore, since the output of the shift circuit 12 becomes $$\frac{1-b2}{2},$$

the value of $$b2 + \frac{1-b2}{2} = \frac{1+b2}{2}$$

is selected for output as the coefficient b2n.

When the control signal n0 is "1", the shift circuit operates so that the signal to be supplied to the full-adder 41 is of logic value "0", and the carry signal output from the half-adder 31 and the outputs of the half-adders 31 to 36 are input to the full-adders 42 to 47 and the half-adder 48. Thus, since the output of the shift circuit 12 becomes $$\frac{1-b2}{2^2},$$

the value of $$b2 + \frac{1-b2}{2^2} = \frac{1+3b2}{4}$$

is selected as the coefficient b2n.

Figure 7:
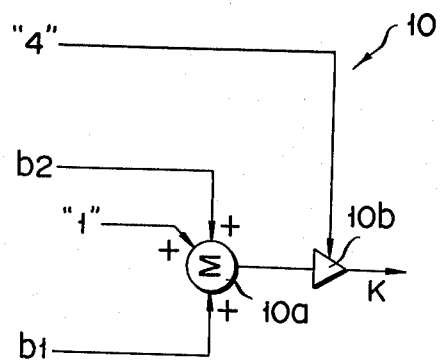
FIG. 7 is a block diagram of another arithmetic circuit in the filter of FIG. 5.

FIG. 7 shows the configuration of the arithmetic circuit 10 in FIG. 5 which is so constructed that it receives two coefficients b1 and b2 as inputs and performs the operation as expressed below.

$$K = \frac{1 + b1 + b2}{4}$$

Referring to FIG. 7, the coefficients b1 and b2 from the ROM 6a are supplied together with a signal representing numeral 1 to the addition input terminals of an adder 10a. The output of the adder 10a is supplied together with a signal representing numeral 4 to a multiplier 10b. The output of the adder 10a represents (1+b1+b2) and is divided by 4 at the multiplier 10b. This division may be accomplished by shifting by 2 bits the decimal point of the output data (1+b1+b2). The output of this multiplier 10b, $$\frac{1 + b1 + b2}{4} = K,$$

is supplied to the multiplier 9 in FIG. 5.

The mode of operation of the digital low-pass filter of the configuration as described above will be described next.

When resonance does not occur in this digital filter apparatus, that is, when Q=(1/√2), the coefficient data b2 corresponding to the cutoff frequency fc is supplied as the coefficient b2n to the multiplier 8 through the arithmetic circuit 11 by making the control signal $n-\infty$ equal to "1" and the other control signals n1 and n0 equal to "0". Then, the digital low-pass filter apparatus shown in FIG. 5 operates as a low-pass filter without a resonance characteristic.

For adding a weak resonance characteristic, the coefficient data b2 corresponding to the cutoff frequency fc is supplied to the arithmetic circuit 11 by making the control signal n0 equal to "1" and the other control signals $n-\infty$ and n1 equal to "0". Inside the arithmetic circuit 11, the shift circuit 12 outputs $$\frac{1-b2}{2^2}$$

so the output of the arithmetic circuit 11 becomes $$\frac{1+3b2}{4}.$$

Accordingly, the data to be applied to the multiplier 8 becomes $$b2n = \frac{1+3b2}{4}$$

and the cutoff frequency fc becomes the resonance frequency, causing weak resonance.

Figure 2:
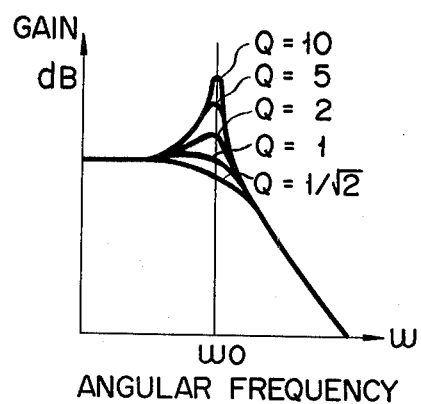
FIG. 2 is a graph showing the resonance characteristic of a conventional analog low-pass filter.

For operating the digital filter apparatus of FIG. 5 to have strong resonance as when Q=10 in FIG. 2, the control signal n1 is made "1" and the other control signals $n-\infty$ and n0 are made "0". As a consequence, the coefficient data b2 corresponding to the cutoff frequency fc is converted to $$\frac{1+b2}{2}$$

at the arithmetic circuit 11, and is then applied to the multiplier 8. Thus, the cutoff frequency fc becomes the resonance frequency, resulting in strong resonance.

In the above embodiment, there are three levels of amplitude in resonance. However, as shown in FIG. 4, n levels of amplitude of resonance may be obtained by increasing the number of levels by dividing into n levels along the imaginary axis (line c) from a pole on the root locus a to the unit circle 01. In this case, the arithmetic circuit 11 may have various circuit constructions as required. For example, the amplitudes of resonance in (l+1) levels may be obtained according to the selection of n when $$b2n = b2 + \frac{1-b2}{2^l} \cdot 2^n (n = -\infty, 0, 1, \ldots l-1).$$

Although the present invention has been applied to a second-order Butterworth low-pass filter in the above embodiment, the present invention is similarly applicable to filters having different characteristics or digital filters of higher order. In such a case, in order to add the resonance characteristic, the coefficient to be increased or decreased may be selected as required.

According to this embodiment, in a digital filter apparatus wherein the coefficients for the transfer function are stored in advance for operation therewith, at least some of the coefficients are increased or reduced to move the poles of the transfer function parallel to the imaginary axis to cause peaks in the amplitude characteristics for adding the resonance characteristic. In this manner, a digital filter apparatus may be provided with the resonance characteristic by simply adding a simple circuit without increasing the capacity of the ROM for storing coefficients. This is quite advantageous in integrating the digital filter apparatus.

However, when the coefficient b2 in equation (11) slightly changes by $$\Delta b2 = \frac{1-b2}{2^2} \cdot 2^n (n = -\infty, 0, 1) \tag{12}$$

the transfer function H(z) becomes $$H(z) = \frac{K(1+z^{-1})^2}{1 + b1z^{-1} + (b2 + \Delta b2)z^{-2}} \tag{13}$$

and $$\lim_{z^{-1} \to 1} H(z) = \frac{4K}{1 + b1 + (b2 + \Delta b2)} \tag{14}$$

when the angular frequency $\omega$ becomes 0, that is, when $z^{-1}$ is 1. When H=1 is substituted in equations (4) to (6), $$K = \frac{1 + b1 + b2}{4} \tag{15}$$

Therefore, by combining equations (14) and (15), the following is obtained $$\lim_{z^{-1} \to 1} H(z) = \frac{1 + b1 + b2}{1 + b1 + (b2 + \Delta b2)} < 1 \tag{16}$$

Figure 8:
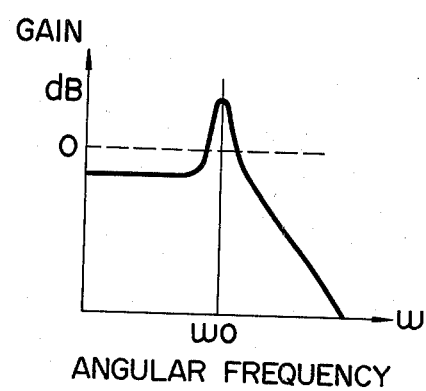
FIG. 8 is a frequency characteristic graph of a digital low-pass filter according to another embodiment of the present invention.

Thus, as shown in FIG. 8, when resonance occurs, although its frequency component is emphasized, the other frequency components are attenuated disadvantageously.

An embodiment will now be described wherein the reduced level is increased to 0 level by utilizing K as expressed by $$K = \frac{1 + b1 + b2 + \Delta b2}{4} \tag{17}$$

$$= \frac{1 + b1 + b2n}{4}$$

instead of K as given by equation (15).

Figure 9:
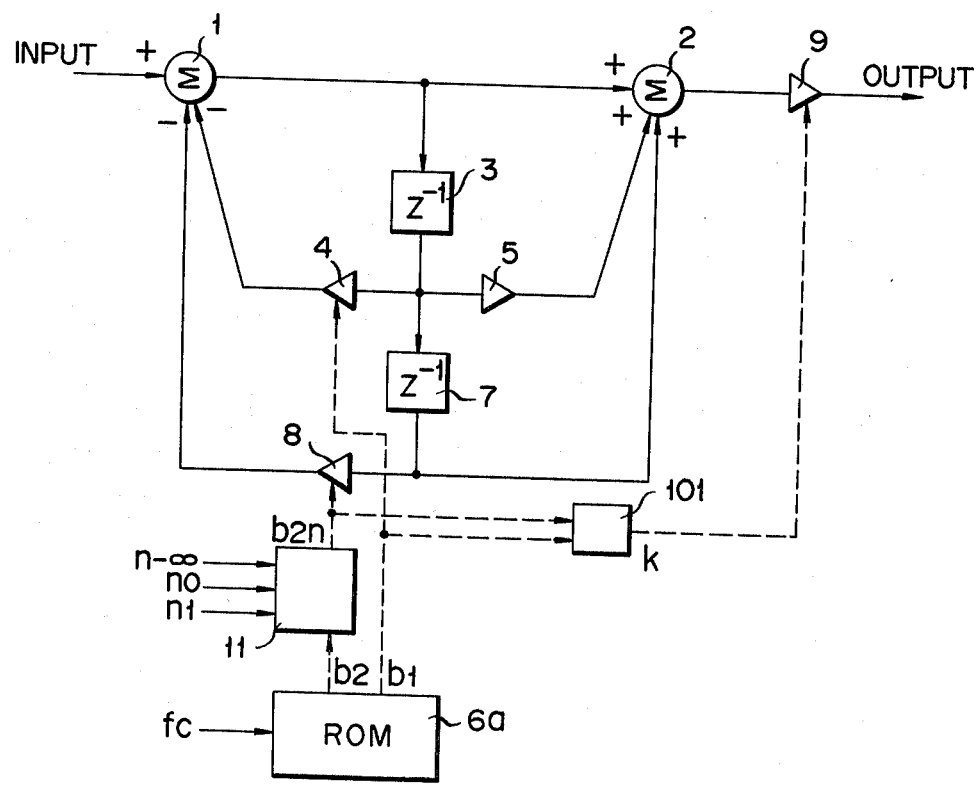
FIG. 9 is a block diagram of a digital low-pass filter according to still another embodiment of the present invention.

FIG. 9 shows a block diagram of this embodiment wherein the same reference numerals denote the same parts as of FIG. 5 for the sake of simplicity, and the description thereof will be omitted.

Reffering to FIG. 9, the ROM 6a stores the coefficients b1 and b2 corresponding to the cutoff frequency fc. The coefficient K which is to be supplied to the multiplier 9 is calculated with the coefficients b1 and b2n obtained at an arithmetic circuit 101. This arithmetic circuit 101 performs the operation $$K = \frac{1 + b1 + b2n}{4}$$

as has been described with reference to equation (17). For this purpose, b2n is used instead of the coefficient b2 which is supplied to the adder 10a in FIG. 7. Thus, data b1 supplied from the ROM 6a, data b2n supplied from the arithmetic circuit 101, and "1" are added at the adder 10a for obtaining data "1+b1+b2n". Thus, this output "1+b1+b2" is supplied to the multiplier 10b where it is divided by "4". The output of the multiplier 10b, that is, $$\frac{1 + b1 + b2n}{4}$$

is supplied to the multiplier 9 as the coefficient K.

For operating the digital filter apparatus shown in FIG. 9 to have no resonance where $Q=1/\sqrt{2}$, the control signal $n-\infty$ is made equal to "1" and the other control signals n1 and n0 are made equal to "0". As a result, the coefficient data b2 corresponding to the cut-off frequency fc is supplied to the multiplier 8 as the coefficient b2n through the arithmetic circuit 11. Accordingly, the digital filter apparatus of FIG. 9 acts as a low-pass filter with no resonance. In this case, the coefficient K becomes a value given by the equation (15).

Whe the filter of FIG. 9 is operated to have weak resonance, only the control signal no is made equal to "1" to supply a coefficient data b2 corresponding to the cutoff frequency fc to the arithmetic circuit 11. As a result, data representing $$\frac{1 - b2}{2^2}$$

is obtained from the shift circuit 12 in the arithmetic circuit 11 and data $$\frac{1 + 3b2}{4}$$

is obtained from the arithmetic circuit 11. Accordingly, data supplied to the multiplier 8 becomes $$b2n = \frac{1 + 3b2}{4}.$$

Thus, the cutoff frequency fc becomes the resonance frequency, resulting in weak resonance. In this case, the coefficient K is calculated at the arithmetic circuit 101 as $$\frac{5 + 4b1 + 3b2}{16}$$

and is supplied to the multiplier 9.

For operating this digital filter apparatus to have strong resonance, the control signal n1 is made equal to "1", and the other control signal $n-\infty$ and n0 are made equal to "0". As a result, the coefficient data b2 corresponding to the cutoff frequency fc is converted $$\frac{1 + b2}{2}$$

at the arithmetic circuit 11 and is supplied to the multiplier 8. Thus, the cutoff frequency fc becomes the resonance frequency, resulting in strong resonance. In this case, the coefficient K is calculated as $$\frac{3 + 2b1 + b2}{8}$$

at the arithmetic circuit 101 and is supplied to the multiplier 9.

Therefore, according to this embodiment, the gain of the amplitude characteristic as shown in FIG. 10 always becomes 1 even under resonance, so that the frequency components other than the frequency at the peak (the angular frequency $\omega 0$) remain the same, and the frequency component at the peak (the angular frequency $\omega 0$) alone is emphasized.

The present invention has been described as applied to a low-pass filter in the embodiments described above. However, the present invention is similarly applicable to a high-pass filter and a band-pass filter.

A case of a second-order high-pass filter will now be described. The transfer function of such an analog filter is generally expressed as $$H(s) = \frac{Hs^2}{s^2 + \frac{\omega 0}{Q} s + \omega 0^2} \tag{18}$$

where H is the gain which is generally 1, Q is the amplitude of resonance which is $1/\sqrt{2}$ under the normal non-resonance condition, and $\omega 0$ is the resonance angular frequency. Under this normal condition, the poles in the s-plane are expressed as $$z = \left(-\frac{1}{\sqrt{2}} \pm j \frac{1}{\sqrt{2}}\right) \cdot \omega 0 \tag{19}$$

As Q becomes larger as shown in FIG. 11, the poles move to the points $(0, \pm\omega 0)$ on the imaginary axis. When this transfer function H(s) undergoes the bilinear z-transform, the transfer function becomes $$H(z) = \frac{K(1 - z^{-1})^2}{1 + b1z^{-1} + b2z^{-2}} \tag{20}$$

where $$b1 = \frac{2\omega 0^2 - \frac{8}{Ts^2}}{\omega 0^2 + \frac{2\omega 0}{QTs} + \frac{4}{Ts^2}} \tag{21}$$

$$b2 = \frac{\omega 0^2 - \frac{2\omega 0}{QTs} + \frac{4}{Ts^2}}{\omega 0^2 + \frac{2\omega 0}{QTs} + \frac{4}{Ts^2}} \tag{22}$$

$$K = \frac{\frac{4H}{T^2}}{\omega 0^2 + \frac{2\omega 0}{QTs} + \frac{4}{Ts^2}} \tag{23}$$

The transfer function for the circuit configuration of this high-pass filter differs only in that the sign for $z^{-1}$ in the numerator on the right side has changed from (+) to (−), as may be seen by a comparison of equations (3) and (20). Thus, it may be easily seen that the circuit configuration becomes substantially the same as that of the embodiment shown in FIGS. 5 or 9. In this case, the coefficient K may be calculated from the coefficients b1 and b2 or from b1 and b2n. Where H=1, it is apparent that they may be respectively obtained as $$K = \frac{1 - b1 + b2}{4}$$

and $$K = \frac{1 - b1 + b2n}{4}$$

When these are compared with the equations for K for the case of the low-pass filter $$K = \frac{1 + b1 + b2}{4} \text{ or } K = \frac{1 + b1 + b2n}{4} \tag{10}$$

they differ only in that the sign of b1 in the numerator of the term on the right has changed from (+) to (−). It follows that it suffices to change the sign of the coefficient b1 to be supplied to the adder 10a from (+) to (−) to have the circuit configuration as shown in FIG. 12. The rest of the circuit configuration is the same as that of FIG. 7.

Embodiments wherein the present invention is applied to a band-pass filter will now be described with reference to FIGS. 13 to 18.

In general, the transfer function H(z) of the band-pass filter is more complicated than those of the low-pass filter and the high-pass filter, and the circuit configuration becomes complex and bulky accordingly. Therefore, in this embodiment, for realizing a band-pass filter, a low-pass filter and a high-pass filter are cascade-connected.

Figure 1:
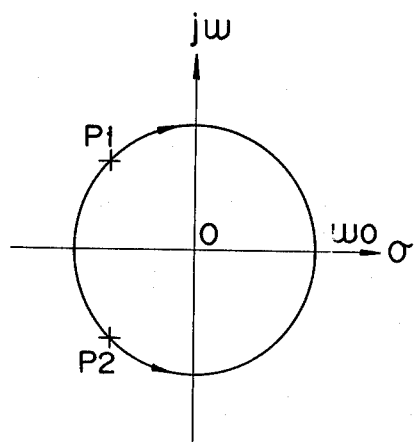
FIG. 1 is a graph showing poles of a conventional analog filter.

The description will be made of a case using a second-order low-pass filter and a second-order high-pass filter. The transfer functions HL(s) (low-pass filter) and HH(s) (high-pass filter) of the analog filters are generally expressed as $$HL(s) = \frac{HL\omega 01^2}{s^2 + \frac{\omega 01}{Q1} s + \omega 01^2} \tag{24}$$

$$HH(s) = \frac{HHs^2}{s^2 + \frac{\omega 02}{Q2} s + \omega 02^2} \tag{25}$$

where HL and HH are gains which are generally 1, Q1 and Q2 are amplitudes of resonance which are generally $1/\sqrt{2}$ under the normal non-resonance condition, and $\omega 01$ and $\omega 02$ are the resonance angular frequencies. Under this normal condition, the poles in the s-plane for both the low-pass filter and the high-pass filter, as in FIG. 1, are expressed as $$z = \left(-\frac{1}{\sqrt{2}} \pm j\frac{1}{\sqrt{2}}\right) \cdot \omega 0 \tag{26}$$

Figure 13:
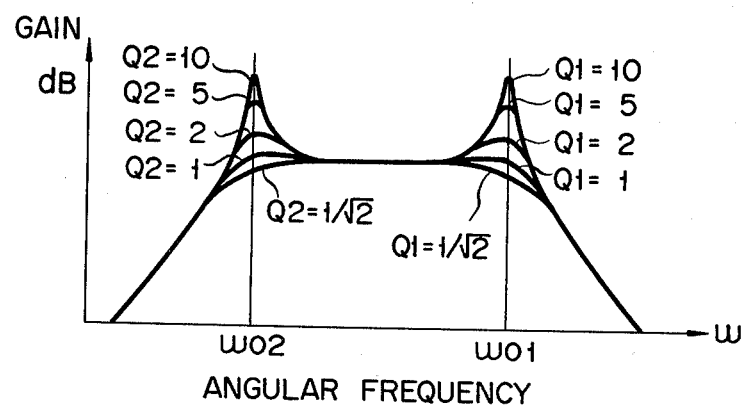
FIG. 13 is a frequency characteristic graph of a digital band-pass filter having a resonance characteristic.

As the values of Q1 and Q2 becomes larger, as shown in FIG. 13, the poles move to the points $(0, \pm\omega 0)$ on the imaginary axis.

When these transfer function HL(s) and HH(s) undergo the bilinear z-transform, they become $$HL(z) = \frac{KL(1 + z^{-1})^2}{1 + b1z^{-1} + b2z^{-2}} \tag{27}$$

$$HH(z) = \frac{KH(1 - z^{-1})^2}{1 + b1z^{-1} + b2z^{-2}} \tag{28}$$

where $$b1 = \frac{2\omega 0^2 - \frac{8}{Ts^2}}{\omega 0^2 + \frac{2\omega 0}{QTs} + \frac{4}{Ts^2}} \tag{29}$$

$$b2 = \frac{\omega 0^2 - \frac{2\omega 0}{QTs} + \frac{4}{Ts^2}}{\omega 0^2 + \frac{2\omega 0}{QTs} + \frac{4}{Ts^2}} \tag{30}$$

$$KL = \frac{HL\omega 01^2}{\omega 01^2 + \frac{2\omega 01}{Q1Ts} + \frac{4}{Ts^2}} \tag{31}$$

$$KH = \frac{\frac{4HH}{Ts^2}}{\omega 02^2 + \frac{2\omega 02}{Q2Ts} + \frac{4}{Ts^2}} \tag{32}$$

In equations (29) and (30), $\omega 0$ represents $\omega 01$ and $\omega 02$, and Q represents Q1 and Q2.

Figure 14:
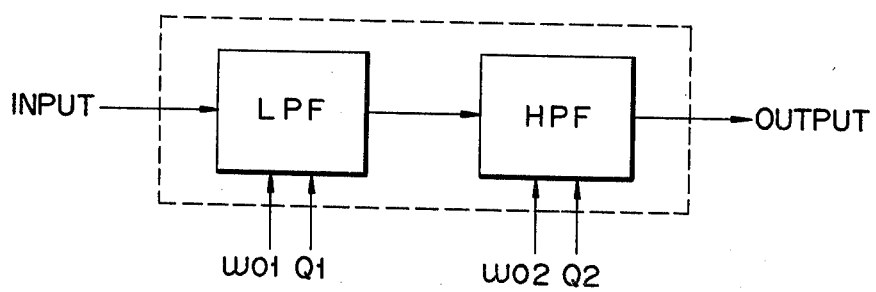
FIG. 14 is a block diagram showing an example of the construction of a digital band-pass filter.

Thus, by connecting the low-pass filter and the high-pass filter whose transfer functions HL(z) and HH(z) are expressed by equations (27) and (28) in cascade connection as shown in FIG. 14, a band-pass filter is realized. Referring to FIG. 14, LPF represents a low-pass filter and HPF represents a high-pass filter. These filters are controlled by control signals from the outside, that is, the resonance angular frequencies $\omega 01$ and $\omega 02$, and Q01 and Q02 which represent the amplitudes of resonance.

For realizing a filter having a characteristic such that peak is obtained at a particular frequency, it suffices that the locus of poles approach the unit circle. In this embodiment, $r^2$, that is, the coefficient b2 alone, is varied along line c of FIG. 4. Further, in this embodiment, the amplitude of resonance has three levels, and the corresponding coefficient is b2n which is given by $$b2n = b2 + \frac{1 - b2}{2^2} \cdot 2^n (n = -\infty, 0, 1) \tag{33}$$

Although the description has been made with reference to a low-pass filter, the same applies to the case of a high-pass filter. That is, the movement of the poles when the cutoff frequency fc2 is varied becomes as shown in FIG. 4. In this case, the zero of second-order becomes (+1, 0).

Therefore, the amplitude of resonance with the high-pass filter of this embodiment also has three levels, and the coefficient corresponding to b2 is b2m which is given by $$b2m = b2 + \frac{1 - b2}{2^2} \cdot 2^m (m = -\infty, 0, 1) \tag{34}$$

Figure 15:
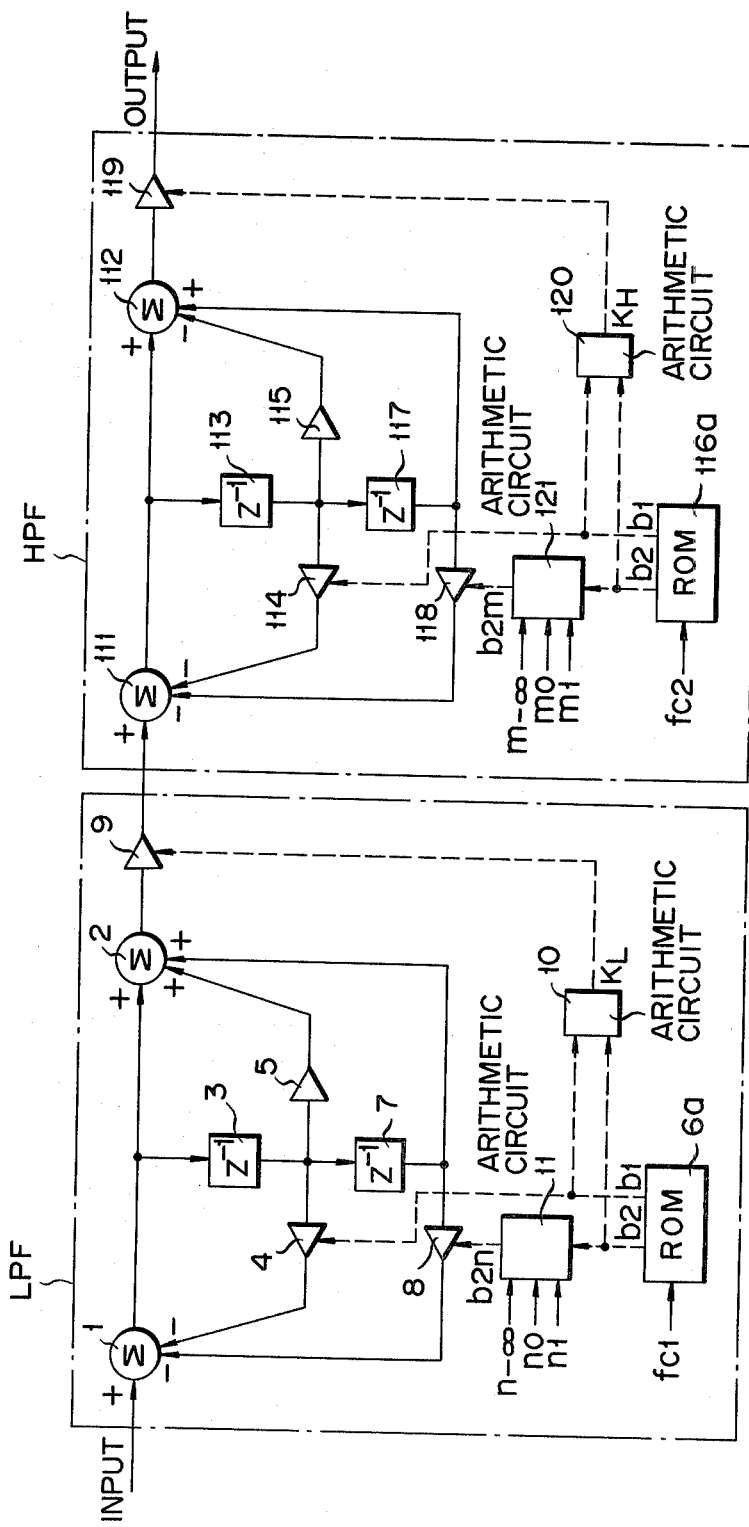
FIG. 15 is a block diagram of a digital band-pass filter according to still another embodiment of the present invention which is designed according to the principle of FIG. 14.

FIG. 15 shows a block diagram of this embodiment. For the sake of simplicity, the same reference numerals in the low-pass filter LPF denote the same parts as in the low-pass filter of FIG. 5, and the description thereof will be omitted. The corresponding parts of the high-pass filter (HPF) are denoted by the corresponding reference numerals for the low-pass filter (LPF) with 110 added.

Referring to FIG. 15, ROMs 6a and 116a store the coefficients b1 and b2 corresponding to cutoff frequencies fc1 and fc2, and coefficients KL and KH which are to be supplied to multipliers 9 and 119 are calculated with these coefficients b1 and b2 at arithmetic circuits 10 and 120. This arithmetic circuit 10 performs the calculation $$KL = \frac{1 + b1 + b2}{4} \quad (35)$$

as may be seen when H=1 is substituted in equations (29) to (31). The arithmetic circuit 120 performs the calculation $$KL = \frac{1 - b1 + b2}{4} \quad (36)$$

as may be seen from equations (29), (30) and (32).

The details of these arithmetic circuits 10 and 120 are as shown in FIGS. 7 and 12.

Reference numberals 11 and 121 in FIG. 15 are arithmetic circuits for calculating coefficients b2n and b2m by performing the operation corresponding to equations (33) and (34) with the coefficient b2 supplied from the ROMs 6a and 116a. These arithmetic circuits 11 and 121 obtain outputs b2n and b2m as shown in Tables 2 and 3 according to control signals n1, n0, n−∞ and m1, m0 and m−∞.

TABLE 2

| n | b2n |
|---|---|
| n1(n = 1) | $\frac{1 + b2}{2}$ |
| n0(n = 0) | $\frac{1 + 3b2}{4}$ |
| n − ∞(n = −∞) | b2 |

TABLE 3

| m | b2m |
|---|---|
| m1(m = 1) | $\frac{1 + b2}{2}$ |
| m0(m = 0) | $\frac{1 + 3b2}{4}$ |
| m − ∞(m = −∞) | b2 |

The arithmetic circuit 11 is constructed as shown in FIG. 6. Since the configuration of the arithmetic circuit 121 is the same as that of the arithmetic circuit 11, the description thereof will be omitted.

The mode of operation of the band-pass filter of the configuration as described above will now be described.

For not adding the resonance characteristic, that is, when Q1=Q2=1/√2 with this band-pass filter, the coefficient data b2 corresponding to the cutoff frequencies fc1 and fc2 are supplied as the coefficients b2n and b2m through the arithmetic circuits 11 and 121 to the multipliers 8 and 118 by making the control signals n−∞ and m−∞ equal to "1" and the control signals n0 and n1 and, m1 and m0 equal to "0". Thus, the band-pass filter as shown in FIG. 15 operates as a band-pass filter without a resonance characteristic.

For weak resonance, the coefficient data b2 corresponding to the cutoff frequency fc1 is supplied to the arithmetic circuit 11 by making, at the low-pass filter LPF, the control signal n0 equal to "1" and the other control signals n−∞ and n1 equal to "0". At the arithmetic circuit 11, $$\frac{1 - b2}{2}$$

is output from the shift circuit 12 shown in FIG. 6 as has already been described. Therefore, the data to be supplied to the multiplier 8 which is the output of the arithmetic circuit 11 becomes $$b2n = \frac{1 + 3b2}{4},$$

and the cutoff frequency becomes the resonance frequency, resulting in weak resonance. Further, by making the control signal m0 equal to "1" and the other control signals m−∞ and m1 equal to "0" at the high-pass filter as well, the cutoff frequency fc2 becomes the resonance frequency, resulting in weak resonance.

In the low-pass filter, for example, when the band-pass filter is operated to have strong resonance, the control signal n1 is made equal to "1" and the other control signals n−∞ and n0 are made equal to "0". Consequently, the coefficient data b2 corresponding to the cutoff frequency fc1 is converted to $$\frac{1 + b2}{2}$$

at the arithmetic circuit 11, which is supplied to the multiplier 8. Therefore, the cutoff frequency fc1 becomes the resonance frequency, resulting in strong resonance. Also at the high-pass filter HPF, by making the control signal m1 equal to "1" and the other control signals m−∞ and m0 equal to "0", the cutoff frequency fc2 becomes the resonance frequency, resulting in strong resonance.

Thus, the band-pass filter of this embodiment comprises the low-pass filter LPF and the high-pass filter HPF which are cascade-connected. A desired resonance characteristic may be achieved at the respective cutoff frequencies fc1 and fc2 by appropriately selecting the values of the control signals n0, n1 and n−∞ and m0, m1, and m−∞ which are to be supplied to the arithmetic circuits 11 and 121. Therefore, resonance of the same amplitude may be achieved at both the cutoff frequencies fc1 and fc2; or, alternatively, strong resonance may be achieved at one of the cutoff frequencies fc1 or fc2, and weak resonance may be achieved at the other cutoff frequency. In this manner, resonances of different amplitudes at the respective cutoff frequencies fc1 and fc2 are also possible.

Figure 16:
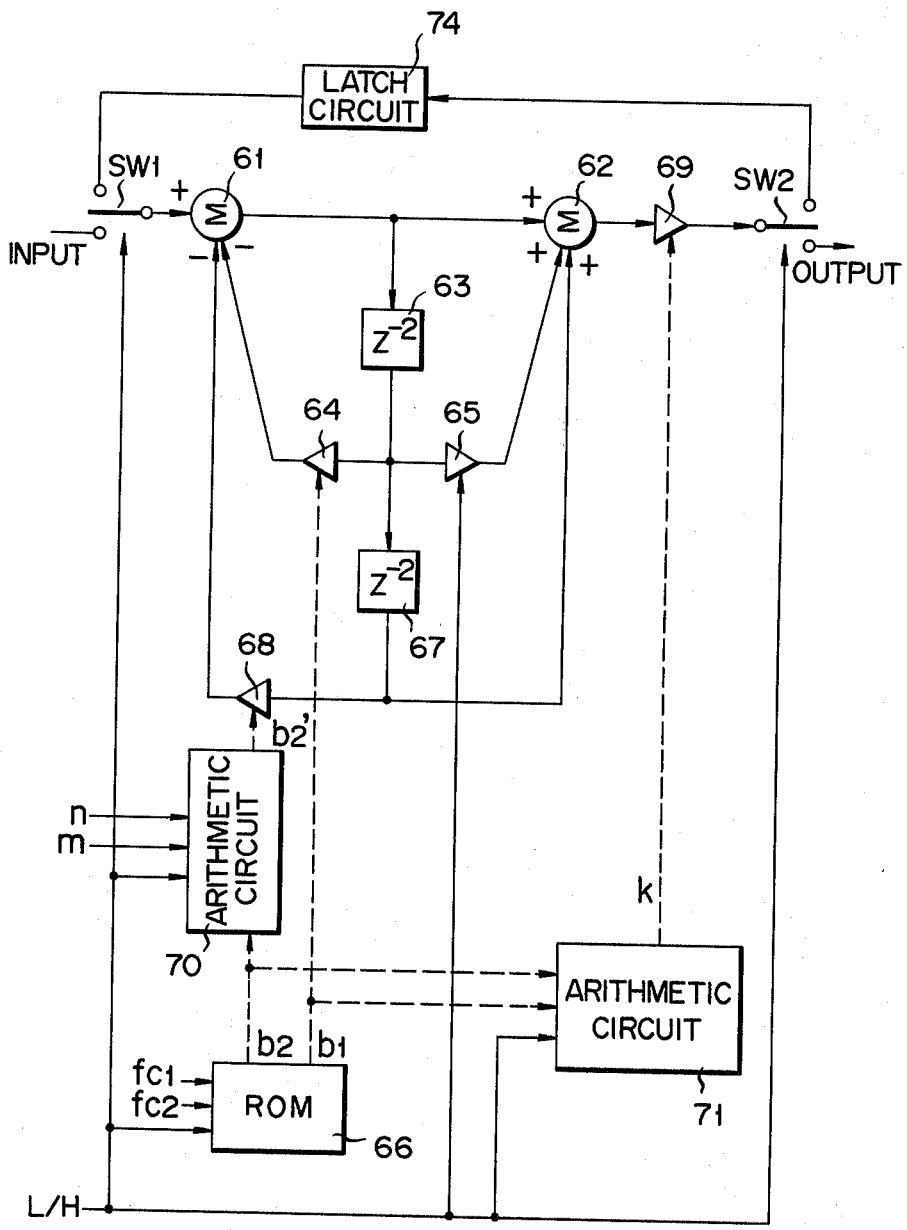
FIG. 16 is a block diagram of a digital band-pass filter according to still another embodiment of the present invention.

Another embodiment of the band-pass filter will be described. FIG. 16 shows the circuit configuration of this embodiment wherein reference numeral 61 is an adder for adding data which is supplied through a switch SW1. The filter has, additionally, an adder 62 to which is supplied the output of the adder 61, and multipliers 64 and 65 to which the output of the adder 61 is supplied through a delay circuit 63 having a delay time of twice that of the sampling time (Ts). To this multiplier 64 is also supplied the data b1 which is selected according to the cutoff frequencies fc1 and fc2 supplied to a ROM 66. At the multiplier 64, the input signal is multiplied by b1 and the multiplication product is supplied to the adder 61. This input signal to the adder 61 instructs subtraction at the adder 61. The multiplier 65 has the function of doubling the input signal according to a switching signal L/H in the case of the low-pass filter and of multiplying the input signal with −2 in the case of the high-pass filter. The output of the multiplier 65 is supplied to the adder 62. The output of the delay circuit 63 is supplied to the adder 61 through a delay circuit 67 having the delay time twice the sampling time (Ts) and further through a multiplier 68; it is also supplied directly to the adder 62. To the multiplier 68 is further supplied data b2′ obtained when the data b2 selected by the cutoff frequencies fc1 and fc2 supplied to the ROM 66 is supplied to an arithmetic circuit 70 for conversion according to the control signals n (n1, n0, n−∞) and m (m1, m0, m−∞). At this multiplier 68, the input signal is multiplied by b2′ and the multiplication product is supplied to the adder 61. This input signal to the adder 61 instructs subtraction at the adder 61.

The configuration of the arithmetic circuit 70 is substantially the same as that of the arithmetic circuit 11 shown in FIG. 6 and differs therefrom in that a gate circuit is further incorporated which selects, in response to the switching signal L/H described above, between the control signals n (n1, n0, n−∞) and m (m1, m0, m−∞) as the control signal for the shift circuit 12. However, this gate circuit is not shown in the figure. Therefore, the relationships between the input signal to and the output data from the arithmetic circuit 70 are shown in Table 4 below:

TABLE 4

| L/H | n | b2′ |
|---|---|---|
| 0 | n1 | $\frac{1 + b2}{2}$ |
|   | n0 | $\frac{1 + 3b2}{4}$ |
|   | n − ∞ | b2 |
| 1 | m1 | $\frac{1 + b2}{2}$ |
|   | m0 | $\frac{1 + 3b2}{4}$ |
|   | m − ∞ | b2 |

The output of the adder 62 to which are supplied the outputs of the adder 61, the multiplier 65, and the delay circuit 67 is supplied to a multiplier 69 where it is multiplied by K and the multiplication product is supplied to a switch SW2.

Figure 17:
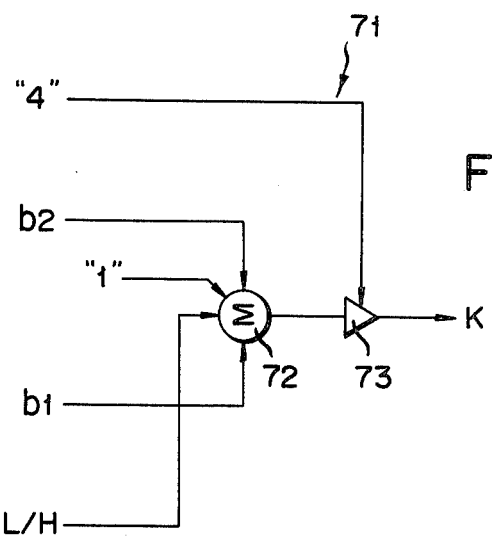
FIG. 17 is a circuit diagram of an arithmetic circuit in the filter of FIG. 16.

Referring to FIG. 17, reference numeral 71 is an arithmetic circuit. The coefficients b1 and b2 supplied from the ROM 66 are supplied to an adder 72. To this adder 72 is also supplied a signal representing a numeral "1". The switching signal L/H is also supplied to the adder 72 for selection so that the adder 72 performs the operation of "1+b1+b2" for realizing a low-pass filter and performs the operation "−b1+b2" for realizing a high-pass filter.

The output of the adder 72 is applied to a multiplier 73 where it is divided by "4". This division is achieved by shifting the decimal point to the left by 2 bits. The operations of equations (35) and (36) are performed in this manner, and the resultant output is supplied to the multiplier 69 as the coefficient data K (i.e., KL and KH).

Referring to FIG. 16, the output of the switch SW2 is controlled according to the switching signal L/H so that it is supplied to the outside as an output of the band-pass filter or it is fed back as an input to the digital filter. In this figure, reference numeral 74 denotes a latch circuit which latches data supplied from the switch SW2 at a timing to be described later and which transfers this data to the switch SW1. The switch SW1 controls according to the switching signal L/H for switching so that the data supplied through the latch circuit 74 is supplied to the digital filter or new input data is supplied to this digital filter.

The mode of operation of this embodiment will now be described. Briefly describing the mode of operation of this embodiment first, the digital filter apparatus first operates, in response to the input data, as a high-pass filter (cutoff frequencey fc2: variable), for example. Then, the digital filter apparatus operates as a low-pass filter (cut-off frequency fc1: variable) for the resultant data obtained from the high-pass filter. Meanwhile, the addition of resonance characteristic is controlled by the arithmetic circuit 70. Therefore, the input signal is output through a band-pass filter having a peak in the amplitude characteristic.

Figure 18:
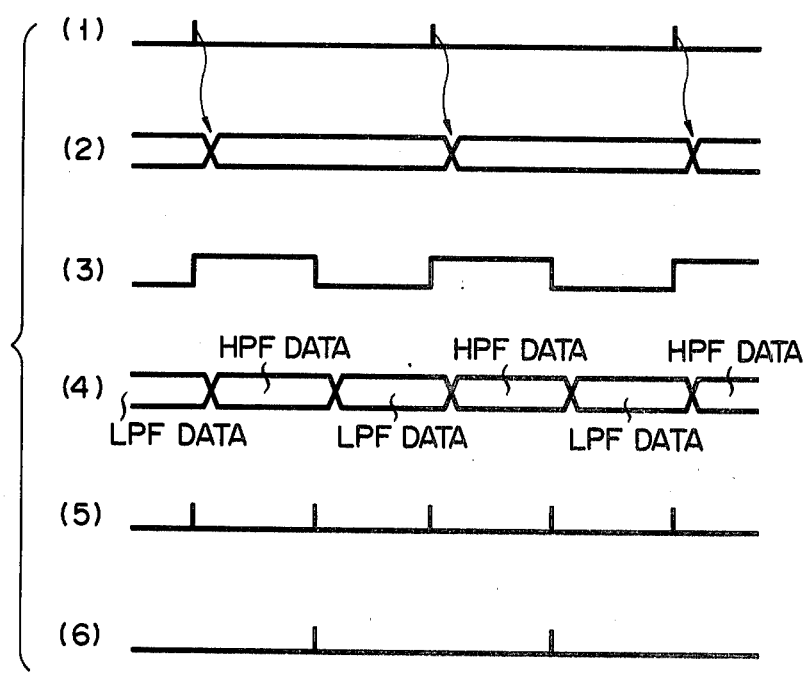
FIG. 18 is a timing chart for explaining the operation of the embodiment shown in FIG. 16.

The input data from the outside is sampled and input at a timing as shown in FIG. 18(1) by the switch SW1. Therefore, the input data is changed as shown in FIG. 18(2). The switching signal L/H is switched as shown in FIG. 18(3). Therefore, the coefficients b1 and b2 corresponding to the desired cutoff frequency fc2 are read out from the ROM 66, and the calculation as represented by equation (36) is performed at the arithmetic circuit 71 to calculate the coefficient KH. In this manner, at the digital filter apparatus as shown in FIG. 18(4), data which has a resonance characteristic according to the operation result of the arithmetic circuit 70 is calculated through the high-pass filter. The resultant data is latched in the delay circuits 63 and 67 at a timing as shown in FIG. 18(5). The output of the multiplier 69 is read in the latch citcuit 74 at a timing as shown in FIG. 18(6) through the switch SW2. The data read in the delay circuits 63 and 67 is delayed until the time for the next operation of the high-pass filter. The data which is output from the delay circuits 63 and 67 when the switching signal L/H is switched to "0" is the data obtained in the preceding operation of the low-pass filter. Meanwhile, from the ROM 66 are read out the coefficients b1 and b2 corresponding to the desired cutoff frequency fc1, and the calculation as represented by equation (35) is executed at the arithmetic circuit 71 to calculate the coefficient KL. Thus, at the digital filter apparatus, in response to the outputs of the latch circuit 74 and the delay circuits 63 and 67 supplied through the switch SW1, data which has a resonance characteristic according to the operation result of the arithmetic circuit 70 is calculated through the low-pass filter. As a consequence, the data is output to the outside through the switch SW2.

In accordance with this embodiment, when the cutoff frequencies of the low-pass filter and the high-pass filter are equal, the coefficients b1 and b2 for the transfer function of the digital filter are entirely the same. Utilizing this, only one kind of data (b1, b2) is stored in the ROM 66. Utilizing the fact that the coefficients K (KL, KH) can be expressed with b1 and b2, they are calculated at the arithmetic circuit 71 from the coefficients b1 and b2 output from the ROM 66. In addition, the arithmetic circuit 70 for adding the resonance characteristic operates according to the control signal n (n1, n0, n−∞) and m (m1, m0, m−∞) according to the selection made between the low-pass filter and the high-pass filter. Therefore, the memory capacity of the ROM 66 may be vastly reduced. In addition to this, the bulk of the hardware for the digital filter apparatus becomes about half that required for a band-pass filter incorporating a cascade-connected low-pass filter and high-pass filter.

There are three levels in the amplitude of the resonance in the above embodiment. However, as shown in FIG. 4, by increasing the number of levels by dividing into n levels from the poles on the root locus to the unit circle 01 along the imaginary axis, n resonance levels may be achieved by realizing various circuit configurations as required. For example, when $$b2n = b2 + \frac{1-b2}{l} \cdot 2^n (n = -\infty, 0, 1, \ldots l - 1) \text{ and}$$

$$b2m = b2 + \frac{1-b2}{2^l} \cdot 2^m (m = -\infty, 0, 1, \ldots l - 1),$$

resonances of (l+1) levels may be selected according to the selection of n and m.

In this embodiment, the present invention is applied to a band-pass filter of a second-order Butterworth low-pass filter and a second-order Butterworth high-pass filter. However, the present invention is similarly applicable to a band-pass filter of higher order. In such a case, the coefficient whose value is to be increased or decreased may also be selected as required.

What we claim is:

1. A digital filter apparatus having resonance characteristics, comprising:
    a digital filter means;
    storing means coupled to said digital filter means for storing coefficients for a transfer function of the digital filter apparatus; and
    first means coupled to said storing means for modifying at least one of said stored coefficients such that said digital filter means produces a peak in an amplitude characteristic of the digital filter apparatus responsive to said stored and modified coefficients.

2. The digital filter apparatus of claim 1, wherein said first means increases or decreases at least one of said stored coefficients to move poles of said transfer function toward the imaginary axis in the z-plane, such that said digital filter means thereby produces said peak in the amplitude characteristic of the digital filter apparatus.

3. A digital filter apparatus having resonance characteristics, comprising:
    means for storing coefficients for a transfer function of the digital filter apparatus;
    digital filter means for filtering a digital input signal in accordance with coefficients derived from said storing means; and
    first means and coupled to said storing means to said digital filtering means for modifying at least one of said coefficients derived from said storing means and for supplying modified coefficients to said digital filter means so as to cause an output signal from said digital filter means to have a peak in an amplitude characteristic thereof.

4. The digital filter apparatus of claim 1 or 3, further comprising second means including means for calculating at least one other of said coefficients based on said at least one modified coefficient supplied by said first means; and means coupled to said digital filter means for controlling the gain of said amplitude characteristic as a function of said at least one calculated coefficient.

5. A digital filter apparatus having resonance characteristics, comprising:
    means for storing coefficients for a transfer function of a low-pass filter;
    digital low-pass filter means for filtering a digital input signal in accordance with coefficients derived from said storing means; and
    first means coupled to said storing means and to said digital low-pass filter means for modifying at least one of said coefficients derived from said storing means and for supplying modified coefficients to said digital low-pass filter means so as to cause an output signal from said digital low-pass filter means to have a peak in an amplitude characteristic at a cutoff frequency.

6. A digital filter apparatus having resonance characteristics, comprising:
    means for storing coefficients for a transfer function of a high-pass filter;
    digital high-pass filter means for filtering a digital input signal in accordance with coefficients derived from said storing means; and
    first means coupled to said storing means and to said digital high-pass filter means for modifying at least one of said coefficients derived from said storing means and for supplying modified coefficients to said digital high-pass filter means so as to cause an output signal from said digital high-pass filter means to have a peak in an amplitude characteristic at a cutoff frequency.

7. The digital filter apparatus of claim 6, further comprising second means including means for calculating at least one other of said coefficients based on said at least one modified coefficient supplied by said first means; and means coupled to said digital filter means for controlling the gain of said apmlitude characteristic as a function of said at least one calculated coefficient.

8. A digital filter apparatus having resonance characteristics, comprising:
    means for storing coefficients for a transfer function of the digital filter apparatus;
    band-pass filter means comprising cascade-connected low-pass filter means and high-pass filter means;
    said band-pass filter means filtering a digital input signal in accordance with coefficients derived from said storing means:
    first means coupled to said storing means and to said low-pass filter means for modifying at least one of said coefficients derived from said storing means for supplying said at least one modified coefficient to said low-pass filter means so as to cause an output signal from said low-pass filter means to have a peak in an amplitude characteristic at a cutoff frequency; and
    second means coupled to said storing means and to said high-pass filter means for modifying at least one of said coefficients derived from said storing means and for supplying said at least one modified coefficient from said second means to said high-pass filter means so as to cause an output signal from said high-pass filter means to have a peak in an amplitude characteristic at a cutoff frequency.

9. A digital filter apparatus having resonance characteristics, comprising:
    means for storing coefficients for a transfer function of the digital filter apparatus;
    band-pass filter means comprising digital filter means time-divisionally operating as a low-pass filter and a high-pass filter, an output of one of said low-pass and high-pass filter being connected to an input of the other of said low-pass and high-pass filter;

control means coupled to said storing means and to said band-pass filter means for modifying at least one of the coefficients stored in said storing means and for supplying said at least one modified coefficient to said band-pass filter means, said control means operating in response to the time divisional operation of said band-pass filter means; and said band-pass filter means outputting a signal having a peak in an amplitude characteristic thereof at a cutoff frequency according to said modified coefficients from said control means.

10. A digital filter apparatus having resonance characteristics, comprising:

means for storing coefficients b1 and b2 for a transfer function HL(z);

said transfer function being $$HL(z) = \frac{KL(1 + z^{-1})^2}{1 + b1z^{-1} + b2z^{-2}} ;$$

first means coupled to said storing means for modifying said stored coefficient b2 to a coefficient b2n;

second means coupled to said storing means and to first means for calculating a coefficient KL, said calculation being executed as follows, $$KL = \frac{1 + b1 + b2n}{4} ;$$

digital filter means coupled to receive said coefficient b1, b2n from said storing means and to receive said coefficient KL, for filtering digital input signal in accordance with said coefficients b1, b2n and KL, and for outputting a signal having a peak in an amplitude characteristic thereof at a cutoff frequency.

11. A digital filter apparatus having resonance characteristics, comprising:

means for storing coefficients b1 and b2 for a transfer function HH(z);

said transfer function being $$HH(z) = \frac{KH(1 - z^{-1})^2}{1 + b1z^{-1} + b2z^{-2}} ;$$

first means coupled to said storing means for modifying said stored coefficient b2 to a coefficient b2n;

second means coupled to said storing means and to first means for calculating a coefficient KH, said calculation being executed as follows, $$KH = \frac{1 - b1 + b2n}{4} ;$$

digital filter means coupled to receive said coefficient b1, b2n from said storing means and to receive said coefficient KH, for filtering a digital input signal in accordance with said coefficients b1, b2n and KH, and for outputting a signal having a peak in an amplitude characteristic thereof at a cutoff frequency.

12. The digital filter apparatus of claim 10 or 11, wherein said first means increases or decreases said coefficient b2 to move poles of said transfer function toward the imaginary axis in the z-plane.

* * * * *

UNITED STATES PATENT AND TRADEMARK OFFICE
CERTIFICATE OF CORRECTION

PATENT NO. : 4,467,440
DATED      : August 21, 1984
INVENTOR(S): Shigenori MORIKAWA, et al It is certified that error appears in the above-identified patent and that said Letters Patent is hereby corrected as shown below:

On the initial page of the patent, change the first inventor's last name from "SANO" to --MORIKAWA--;

Column 4, line 21, after "root locus" change "becomes is as" to --is--;

Column 18 (claim 7), line 36, change "apmlitude" to --amplitude--;

Column 19 (claim 10), line 30, second equation, after ";" insert --and--;

Column 20 (claim 11), between lines 20 and 24, second equation, after ";" insert --and--.

Signed and Sealed this

Twenty-third Day of April 1985

[SEAL]

Attest:

DONALD J. QUIGG

Attesting Officer

Acting Commissioner of Patents and Trademarks

UNITED STATES PATENT AND TRADEMARK OFFICE
CERTIFICATE OF CORRECTION

PATENT NO. :  4,467,440
DATED      :  August 21, 1984
INVENTOR(S) : Shigenori MORIKAWA et al It is certified that error appears in the above-identified patent and that said Letters Patent is hereby corrected as shown below:

Column 17, line 55 (claim 3), after "first means", delete "and";

after "storing means", insert --and--.

Signed and Sealed this

Tenth Day of September 1985

[SEAL]

Attest:

DONALD J. QUIGG

Attesting Officer  Acting Commissioner of Patents and Trademarks - Designate